(12) United States Patent
Imonigie et al.

(10) Patent No.: US 9,614,153 B2
(45) Date of Patent: *Apr. 4, 2017

(54) METHODS OF SELECTIVELY DOPING CHALCOGENIDE MATERIALS AND METHODS OF FORMING SEMICONDUCTOR DEVICES

(71) Applicant: Micron Technology, Inc., Boise, ID (US)

(72) Inventors: Jerome A. Imonigie, Boise, ID (US); Prashant Raghu, Boise, ID (US); Theodore M. Taylor, San Diego, CA (US); Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 111 days.

This patent is subject to a terminal disclaimer.

(21) Appl. No.: 14/607,329

(22) Filed: Jan. 28, 2015

(65) Prior Publication Data

US 2015/0140777 A1    May 21, 2015

Related U.S. Application Data

(63) Continuation of application No. 13/094,024, filed on Apr. 26, 2011, now Pat. No. 8,962,460.

(51) Int. Cl.
*H01L 45/00* (2006.01)

(52) U.S. Cl.
CPC ........ *H01L 45/1658* (2013.01); *H01L 45/085* (2013.01); *H01L 45/1233* (2013.01);
(Continued)

(58) Field of Classification Search
None
See application file for complete search history.

(56) References Cited

U.S. PATENT DOCUMENTS

| 4,350,541 A | 9/1982 | Mizushima et al. |
| 6,727,192 B2 | 4/2004 | Moore et al. |

(Continued)

OTHER PUBLICATIONS

Stronski, A., O. Paiuk, A. Gudymenko, V. Klad'Ko, P. Oleksenko, N. Vuichyk, M. Vič ek, I. Lishchynskyy, E. Landeranta, A. Lashkul, A. Gubanova, and Ts. Krys'Kov. "Effect of Doping by Transitional Elements on Properties of Chalcogenide Glasses." Ceramics International 41.6 (2015): 7543-548.*

(Continued)

*Primary Examiner* — Joseph Schoenholtz
(74) *Attorney, Agent, or Firm* — TraskBritt

(57) ABSTRACT

Methods of selectively forming a metal-doped chalcogenide material comprise exposing a chalcogenide material to a transition metal solution, and incorporating transition metal of the transition solution into the chalcogenide material without substantially incorporating the transition metal into an adjacent material. The chalcogenide material is not silver selenide. Another method comprises forming a chalcogenide material adjacent to and in contact with an insulative material, exposing the chalcogenide material and the insulative material to a transition metal solution, and diffusing transition metal of the transition metal solution into the chalcogenide material while substantially no transition metal diffuses into the insulative material. A method of doping a chalcogenide material of a memory cell with at least one transition metal without using an etch or chemical mechanical planarization process to remove the transition metal from an insulative material of the memory cell is also disclosed, wherein the chalcogenide material is not silver selenide.

20 Claims, 7 Drawing Sheets

(52) U.S. Cl.
CPC .......... *H01L 45/142* (2013.01); *H01L 45/143* (2013.01); *H01L 45/144* (2013.01); *H01L 45/1608* (2013.01); *H01L 45/1641* (2013.01)

(56) References Cited

U.S. PATENT DOCUMENTS

| | | |
|---|---|---|
| 6,867,114 B2 | 3/2005 | Moore et al. |
| 6,878,569 B2 | 4/2005 | Li |
| 6,890,790 B2 | 5/2005 | Li et al. |
| 7,294,527 B2 | 11/2007 | Campbell et al. |
| 7,687,793 B2 | 3/2010 | Harshfield et al. |
| 8,962,460 B2 * | 2/2015 | Imonigie ............... H01L 45/085 438/510 |
| 2004/0147062 A1 | 7/2004 | Sinha |
| 2008/0023798 A1 | 1/2008 | Mege |
| 2008/0085419 A1 * | 4/2008 | Klein .................... C23C 18/165 428/457 |
| 2008/0314739 A1 | 12/2008 | Gopalakrishnan et al. |
| 2010/0291748 A1 | 11/2010 | Dressler et al. |
| 2012/0276725 A1 | 11/2012 | Imonigie et al. |

OTHER PUBLICATIONS

Mitkova, M., and M.n. Kozicki. "Ag-photodoping in Ge-chalcogenide Amorphous Thin Films-Reaction Products and Their Characterization." Journal of Physics and Chemistry of Solids 68.5-6 (2007): 866-72.*

Frumar, Miloslav, and Tomas Wagner. "Ag Doped Chalcogenide Glasses and Their Applications." Current Opinion in Solid State and Materials Science 7.2 (2003): 117-26.*

* cited by examiner

METHODS OF SELECTIVELY DOPING CHALCOGENIDE MATERIALS AND METHODS OF FORMING SEMICONDUCTOR DEVICES

CROSS-REFERENCE TO RELATED APPLICATION

This application is a continuation of U.S. patent application Ser. No. 13/094,024, filed Apr. 26, 2011, now U.S. Pat. No. 8,962,460, issued Feb. 24, 2015, the disclosure of which is hereby incorporated herein in its entirety by this reference.

TECHNICAL FIELD

Embodiments of the present disclosure relate to semiconductor device fabrication and, more specifically, to methods of forming metal-doped chalcogenide materials, and to methods of forming semiconductor device structures including metal-doped chalcogenide materials.

BACKGROUND

As conventional memory cell structures approach scaling limits, other memory cell structures, such as resistive random access memory (RRAM) cells and programmable metallization cells (PMCs) may enable increased miniaturization of electronic devices. Because PMCs provide benefits of low power usage, long useful life, and high memory density, PMCs may replace other forms of memory cell structures in production.

Conventionally, a PMC includes an electrolytic active material and a metal species that reversibly forms a conductive bridge across the electrolytic active material. The conductive bridge may form and dissipate based on an applied electric field, which causes a redox reaction at the electrode interfaces and cationic drift. For this reason, PMCs are referred to herein and in the art as "conductive-bridging RAM" or "CBRAM." The electrolytic active material includes at least one of a chalcogenide and an oxide. The metal species includes a transition metal, such as silver, copper, or nickel.

Conventional CBRAM devices are fabricated by physical vapor deposition or chemical vapor deposition of the materials (the electrolytic active layer and the metal species) over a substrate. Because the materials are deposited globally, further processing (e.g., chemical etching or chemical-mechanical polishing) is required to isolate individual memory cells. Since many transition metals are not selectively etchable, these processes may remove portions of the metal species from the substrate, making formation of CBRAM with ever-smaller dimensions difficult. For example, silver and copper are difficult to etch with the proper selectivity needed to form CBRAM.

Known methods of forming metal-rich chalcogenides are described in U.S. Pat. No. 6,878,569. The method includes depositing a chalcogenide material, a dopant, and a thin barrier material. The dopant is diffused into the chalcogenide material with UV rays (i.e., photodoping) to form a doped chalcogenide.

U.S. Pat. No. 7,294,527 describes formation of a metal-rich metal chalcogenide, such as a silver-rich silver selenide material, without the direct deposition of the metal or photodoping techniques. Chalcogenide glass is formed over an electrode, and silver chalcogenide is formed over the chalcogenide by physical vapor deposition, evaporative deposition, or sputtering. The deposited silver chalcogenide is treated with a nitrate solution to increase the silver content of the silver chalcogenide.

U.S. Pat. No. 6,890,790 also describes formation of a metal-doped chalcogenide without the direct deposition of the metal or photodoping techniques. Chalcogenide glass and metal are formed by co-sputtering the metal and chalcogenide glass.

To avoid the problems associated with removal of portions of active metal species, methods of selectively forming active metal species for use in CBRAM are desired.

DETAILED DESCRIPTION

The following description provides specific details, such as material types and processing conditions, in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device, i.e., the semiconductor device structures described below do not form a complete semiconductor device. Only those process acts and structures necessary to understand the embodiments of the present disclosure are described in detail below. Additional acts to form a complete semiconductor device from the semiconductor device structures may be performed by conventional semiconductor fabrication techniques, which are not described in detail herein.

Methods of forming a metal-doped chalcogenide material and methods of forming a semiconductor device structure having a metal-doped chalcogenide material are disclosed. In particular, a chalcogenide material may be exposed to a transition metal solution to form the metal-doped chalcogenide material. The methods may be used to form a transition metal-doped chalcogenide material. The methods may be used to selectively dope exposed regions of the chalcogenide material without doping adjacent or surrounding materials (e.g., insulating materials), which are also exposed. Therefore, further process acts, such as cleaning or removal of the metal dopant from the adjacent materials, may be avoided. Since the transition metal does not diffuse into adjacent materials, a need for subsequent etching or cleaning of the adjacent materials may be reduced or eliminated. Additionally, the selective doping of the transition metal into the chalcogenide material may be accomplished without a photoexposure act (i.e., without photodoping).

The doping mechanism of the present disclosure may include a redox or replacement reaction between a cationic species of the chalcogenide material and a transition metal species in the transition metal solution. The cationic species may become oxidized and replaced with a concomitantly reduced transition metal. The cationic species may be removed from the chalcogenide material as it oxidizes, leaving a metal-doped chalcogenide material. The concentration of the transition metal solution, the temperature, and the exposure time may affect the concentration of the transition metal in the metal-doped chalcogenide material. The stoichiometry of the chalcogenide material and the transition metal solution may affect the stoichiometry of the metal-doped chalcogenide material formed.

Figure 1:
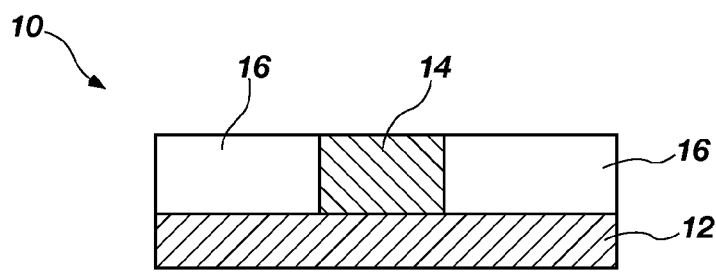
FIGS. 1 through 5 are partial cross-sectional views illustrating an embodiment of a method of forming a metal-doped chalcogenide material according to the present disclosure.

FIGS. 1 through 5 illustrate an embodiment of the present disclosure, in which a CBRAM cell is formed. FIG. 1 shows a semiconductor device structure 10 having a first electrode 12, a chalcogenide 14, and an insulator 16. The chalcogenide 14 and the insulator 16 may be exposed in that at least a portion of the chalcogenide 14 and the insulator 16 may come into contact with the transition metal solution. The first electrode 12, the chalcogenide 14, and the insulator 16 may be formed by methods known in the art, which methods not described in detail herein. By way of example, the insulator 16 may be formed on the first electrode 12, patterned to form an opening therein, and the chalcogenide 14 formed in the opening. The first electrode 12, the chalcogenide 14, and the insulator 16 may be part of a larger structure, such as a structure configured to become a memory device. For example, the first electrode 12 may be formed on a substrate (not shown), and may be formed from any suitable conductive material (e.g., tungsten, tungsten nitride, tungsten silicide, polysilicon, titanium nitride, tantalum, tantalum nitride, copper, ruthenium, a metal silicide, etc.). In one embodiment, the first electrode 12 is formed from tungsten, the chalcogenide 14 is formed from $GeS_2$, and the insulator 16 is formed from $Si_3N_4$. The semiconductor device structure 10 may be free of other metal materials during the described doping process such that no other exposed metal materials come into contact with the transition metal solution.

The chalcogenide 14 may be a chemical compound including at least one chalcogen ion (i.e., an ion of a member of group 16 of the periodic table, also known as the oxygen family) and at least one electropositive element (i.e., a cation). The chalcogen ion may be oxygen (O), sulfur (S), selenium (Se), tellurium (Te), or polonium (Po). The electropositive element may include, but is not limited to, nitrogen (N), silicon (Si), nickel (Ni), gallium (Ga), germanium (Ge), arsenic (As), silver (Ag), indium (In), tin (Sn), antimony (Sb), gold (Au), lead (Pb), bismuth (Bi), or combinations thereof. The chalcogenide 14, as deposited, may be substantially free of silver or other transition metals, such as copper or nickel. For instance, the chalcogenide 14, as deposited, may exclude a silver selenide material. By way of example and not limitation, the chalcogenide 14 may be $GeS_2$, GeSe, GeTe, $SnS_2$, SnSe, SnTe, $As_2S_3$, $As_2Se_3$, AsTe, $Sb_2S_3$, $Sb_2Se_3$, SbTe, $Sb_2Te_3$, $In_2Se_3$, SnTe, $Bi_2Te_3$, SnSe, or InTe. The chalcogenide 14 may include a binary chalcogenide, a ternary chalcogenide, or a quaternary chalcogenide. The chalcogenide 14 may also include alloys or mixtures, such as GeSbTe (referred to as GST), GeAsSeTe, GeSeTeTl, or GeSeTe.

The insulator 16 may be formed from a suitable insulative material used in semiconductor fabrication. For example, the insulator 16 may be a dielectric material, such as a silicon nitride (e.g., $Si_3N_4$) or a silicon oxide (e.g., $SiO_2$).

Figure 2:
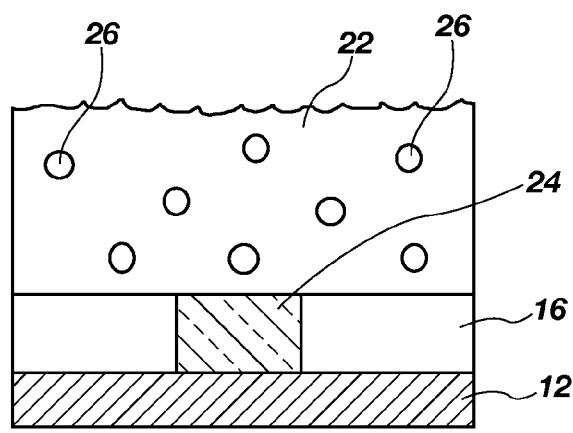

As shown in FIG. 2, the semiconductor device structure 10 may be subjected to a transition metal solution 22. The transition metal solution 22 may include an aqueous solution of transition metal ions 26. The transition metal ions 26 may include gold (Au), silver (Ag), platinum (Pt), copper (Cu), cadmium (Cd), ruthenium (Ru), cobalt (Co), chromium (Cr), nickel (Ni), manganese (Mn), molybdenum (Mo), other transition metal ions, or combinations thereof to be doped into the chalcogenide 14. In one embodiment, the transition metal ions 26 are silver ions ($Ag^+$), copper ions ($Cu^{2+}$), or nickel ions ($Ni^{2+}$). The transition metal ions 26 may be ions other than ions of the electropositive element of the chalcogenide 14. The transition metal solution 22 may be formed by dissolving a transition metal salt in water. For example, the transition metal solution 22 may be formed by mixing $AgNO_3$, AgF, $AgC_2H_3O_2$, $AgMnO_4$, $Ag_2SO_4$, $Cu(NO_3)_2$, $CuCl_2$, $CuBr_2$, $Cu(C_2H_3O_2)_2$, $CuSO_4$, or combinations thereof with water.

As the semiconductor device structure 10 is exposed to the transition metal solution 22, the transition metal ions 26 may react with the chalcogenide 14 (FIG. 1). Without being bound to a particular theory, it is believed that a redox or replacement reaction occurs between the transition metal ions 26 and the chalcogen ion of the chalcogenide 14 during the exposure to the transition metal solution 22. The chalcogen ions of the chalcogenide 14 may become oxidized and replaced with the transition metal atoms, concomitantly reduced from the transition metal ions 26 of the transition metal solution 22. The transition metal atoms may diffuse into the chalcogenide 14, forming a metal-doped chalcogenide material 24. For example, if the chalcogenide 14 is $GeS_2$ and the transition metal solution 22 is an aqueous $AgNO_3$ solution (i.e., $Ag^+$ ions and $NO_3^-$ ions in water), Ag may replace Ge in the chalcogenide 14. Without being bound to any particular theory, $Ge^{4+}$ may be oxidized and dissolve in the aqueous transition metal solution 22, while $Ag^+$ ions may be reduced and deposit on or in the $GeS_2$, forming the metal-doped chalcogenide material 24. The redox reaction may incorporate the transition metal of the transition metal solution 22 into the chalcogenide 14. The transition metal may be incorporated into the chalcogenide 14 in the absence of light or radiation. After exposing the semiconductor device structure 10 to the transition metal solution 22, the displaced chalcogenide ions of the chalcogenide 14 may be present in the transition metal solution 22, evidencing depletion of the chalcogenide ions from the chalcogenide 14. By way of example, if $GeS_2$ is used as the chalcogenide 14 and is exposed to an $AgNO_3$ solution, the $AgNO_3$ solution may include germanium ions, evidencing depletion of germanium from the $GeS_2$ during diffusion of the silver ions into the $GeS_2$.

While the chalcogenide 14 and the insulator 16 may both be exposed to the transition metal solution 22, the insulator 16 may remain substantially free of transition metal ions 26. As used herein, the term "substantially free" means and include less than or equal to approximately 1% (atomic) of the transition metal within 20 Å of the exposed surface. Therefore, the chalcogenide 14 may be selectively doped with the transition metal ions 26 while the insulator 16 remains substantially free of the transition metal ions 26. The metal-doped chalcogenide material 24 may include a metal-rich region of the chalcogenide 14. The metal-doped chalcogenide material 24 may include a concentration gradient of the transition metal in the chalcogenide 14 or may be a homogeneous composition of the transition metal and the chalcogenide 14. The metal-doped chalcogenide material 24 may, alternatively, include a phase-separated material in which the transition metal is distributed in the chalcogenide 14. The metal-doped chalcogenide material 24 may, optionally, be exposed to UV irradiation subsequent to the metal-doping process.

The amount of transition metal in the metal-doped chalcogenide material 24 may vary based upon the transition metal solution 22 and process conditions. For example, the amount of transition metal in the metal-doped chalcogenide material 24 may vary with the concentration and identity of transition metal ions 26 in the transition metal solution 22, the exposure time, the temperature of the transition metal solution 22, and the temperature of the chalcogenide 14. A person having ordinary skill in the art may vary one or more identified or other process conditions to form the metal-doped chalcogenide material 24 having a selected concentration of the selected transition metal.

For example, the semiconductor device structure 10 including the insulator 16 and the chalcogenide 14 may be exposed to the transition metal solution 22 having a concentration from about 0.001 M (mol/l) to about 40 M of transition metal ions 26, such as from about 0.02 M to about 2.0 M or from about 0.02 M to about 0.2 M. In some embodiments, the concentration of transition metal ions 26 in the transition metal solution 22 may be from about 0.1 M to about 0.5 M. The semiconductor device structure 10 may be exposed to the transition metal solution 22 for a period of time from about one second (1 s) to about twenty minutes (1200 s), such as from about 1 second to about ten minutes (600 s), or from about 10 s to about two minutes (120 s). In one embodiment, the exposure time is from about 5 s to about 30 s. The transition metal solution 22 may be applied to the semiconductor device structure 10 as a spray, a rinse, or a bath. For example, the semiconductor device structure 10 may be immersed in the transition metal solution 22, such as in a dip tank or by a spin-coating process. The semiconductor device structure 10 may be exposed to the transition metal solution 22 at various temperatures. For example, the temperature of the transition metal solution 22 may be as low as 0° C. or as high as 80° C., such as from about 25° C. to about 50° C. The concentration of the transition metal in the transition metal solution 22 may depend on a temperature of the solvent, such as water.

Exposure of the chalcogenide 14 to the transition metal solution 22 may cause the transition metal to diffuse into the chalcogenide 14. The resulting metal-doped chalcogenide material 24 may include from about 1% to about 50% of the transition metal, such as from about 5% to about 30%. Upon further exposure to the transition metal solution 22, the concentration of transition metal within the metal-doped chalcogenide material 24 may not increase. However, further exposure to the transition metal solution 22 may cause the precipitation of transition metal material on a surface of the metal-doped chalcogenide material 24. Further exposure to the transition metal solution 22 may also cause a transition metal-rich layer to form proximate an exposed surface of the metal-doped chalcogenide material 24.

Figure 3:
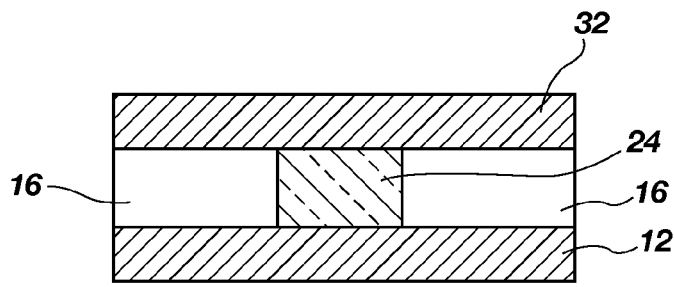

The semiconductor device structure 10 may be removed from contact with the transition metal solution 22 after a selected exposure time. As shown in FIG. 3, a second electrode 32 may be formed on the insulator 16 and the metal-doped chalcogenide material 24. The second electrode 32 may be formed of the same material as the first electrode 12, or may be formed of a different material. For example, the second electrode 32 may be formed from any suitable conductive material (e.g., tungsten, tungsten nitride, tungsten silicide, polysilicon, titanium nitride, tantalum, tantalum nitride, copper, ruthenium, a metal silicide, etc.).

Figure 4:
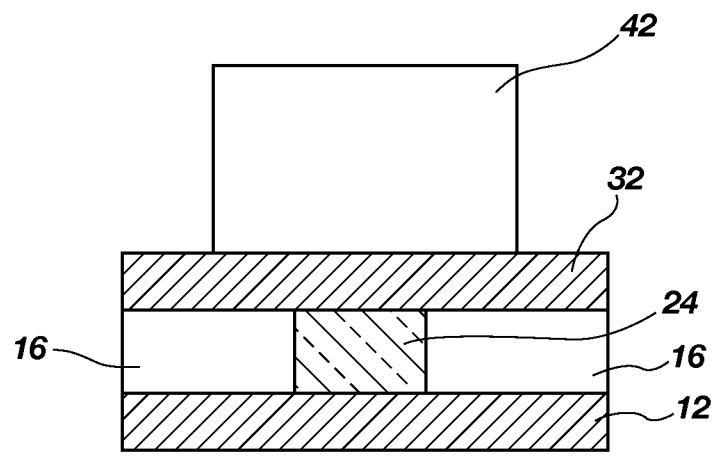
Figure 5:
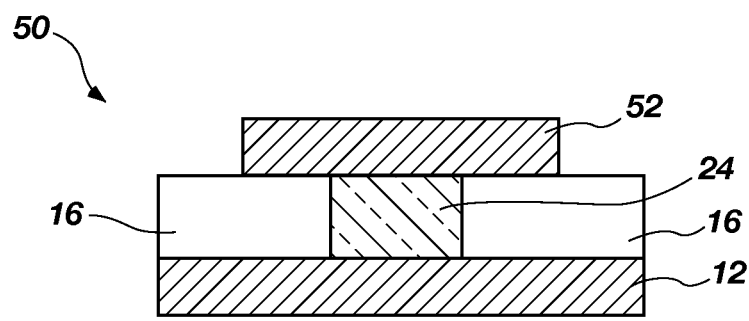

As shown in FIG. 4, a mask 42 may be formed over the second electrode 32. The mask 42 may be a photoresist or other material selected to protect an underlying portion of the second electrode 32 during etching of other portions of the second electrode 32. The photoresist may be patterned, such as by photolithography methods known in the art, to produce the mask 42. The mask 42 and the second electrode 32 may be subjected to an etchant to remove a portion of the second electrode 32 not protected by the mask 42. The mask 42 may be substantially resistant to the etchant, which may be selected by a person of ordinary skill in the art. The etchant may be used to remove a portion of the second electrode 32, and may be selected to remove material of the second electrode 32 at a faster rate than material of the mask 42. The etchant may contact the second electrode 32 and the mask 42 until material of the second electrode 32 is substantially removed from an area not covered by the mask 42. That is, the etchant may substantially remove all the unmasked material of the second electrode 32. The underlying material of the insulator 16 may function as an etch stop. As shown in FIG. 5, after the second electrode 32 is etched, the mask 42 may be removed, such as with another etchant or by an abrasive planarization process, such as chemical mechanical planarization (CMP), to form a memory cell 50 and to expose a remainder 52 of the second electrode 32. Additional, conventional processing acts, which are not described in detail herein, may be conducted to configure the memory cell 50 as a crosspoint memory cell.

Figure 6:
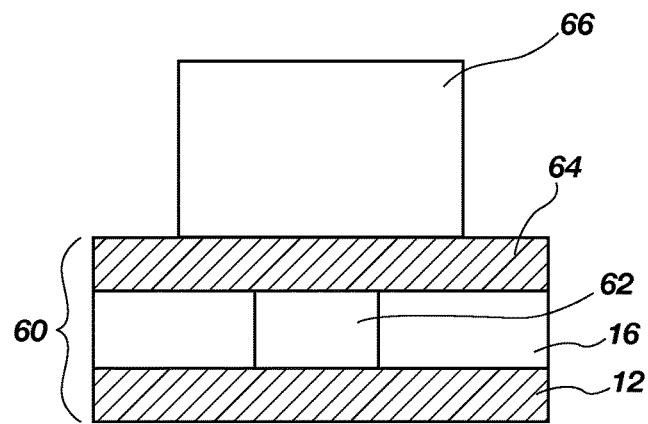
FIGS. 6 through 11 are partial cross-sectional views illustrating another embodiment of a method of forming a metal-doped chalcogenide material according to the present disclosure.

FIGS. 6 through 11 illustrate an embodiment of the present disclosure in which a planar CBRAM cell is formed. FIG. 6 shows a semiconductor device structure 60 having a first electrode 12, an insulator 16, a bottom electrode contact 62, and a chalcogenide 64. The first electrode 12, the insulator 16, the bottom electrode contact 62, and the chalcogenide 64 may be formed by methods known in the art, which methods are not described in detail herein. By way of example, the insulator 16 may be formed on the first electrode 12, patterned to form an opening therein, and the bottom electrode contact 62 formed in the opening. The chalcogenide 64 may be formed over the insulator 16 and the bottom electrode contact 62. The first electrode 12, the insulator 16, the bottom electrode contact 62, and the chalcogenide layer 64 may be part of a larger structure, such as a structure configured to become a memory device. For example, the first electrode 12 may be formed on a substrate (not shown), and may be a metal such as tungsten. The bottom electrode contact 62 may be formed, for example, by removing a portion of the insulator 16, depositing a conductor (e.g., titanium nitride (TiN)) in the opening over the first electrode 12, and planarizing the conductor (e.g., by CMP). The chalcogenide 64 may be formed over the insulator 16 and the bottom electrode contact 62.

A mask 66 may be formed over a portion of the chalcogenide 64. For example, the mask 66 may be formed over a portion of the chalcogenide 64 disposed over the titanium nitride 62. The mask 66 may be formed of a material that withstands etchants used to remove a portion of the chalcogenide 64. The mask 66 and the semiconductor device structure 60 may be subjected to a first etchant, such as an anisotropic etchant selective to the material of the chalcogenide 64. In other words, the first etchant may remove the material of the chalcogenide 64 at a higher rate than it removes the mask 66. The first etchant may be selected by a person of ordinary skill in the art based on the materials used as the mask 66 and the chalcogenide 64. The underlying insulator 16 may function as an etch stop. After exposure to the first etchant, a portion of chalcogenide 72 (FIG. 7) may remain over the titanium nitride 62 and a portion of the insulator 16.

Figure 7:
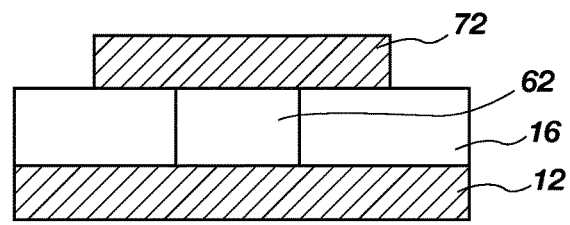

As shown in FIG. 7, the mask 66 may be removed, such as by a second etchant selective to the material of the mask 66. The second etchant may remove the mask 66 without substantially removing the chalcogenide 72 and the insulator 16. The second etchant may be selected by a person of ordinary skill in the art based on the materials used as the mask 66, the chalcogenide 72, and the insulator 16.

Figure 8:
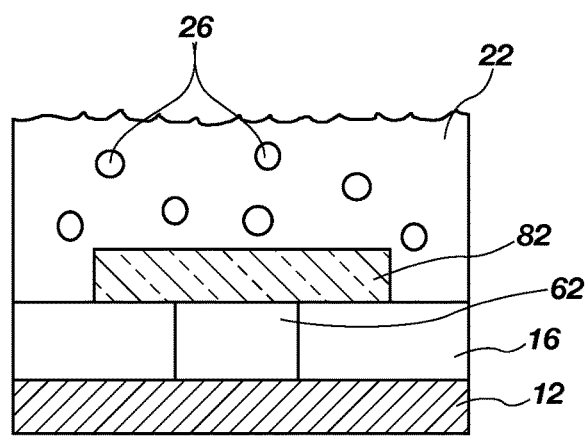

The chalcogenide 72 and the insulator 16 may then be exposed to a transition metal solution 22, as shown in FIG. 8. The transition metal solution 22 may be substantially similar to the transition metal solution 22 shown in FIG. 2 and described above. The transition metal solution 22 may include transition metal ions 26 dissolved in water. The transition metal ions 26 in the transition metal solution 22 may react with chalcogenide 72, such as in the redox reaction described above. The reaction between the chalcogenide 72 and the transition metal ions 26 may produce a metal-doped chalcogenide material 82, shown in FIG. 8, similar in composition to the metal-doped chalcogenide material 24 shown in FIG. 2 and described above. Exposure of the insulator 16 to the transition metal solution 22 may have substantially no effect on the insulator 16. Though transition metal ions 26 may react with the chalcogenide 72, the transition metal ions 26 may be substantially non-reactive with the insulator 16. Therefore, cleaning or removal of the insulator 16 may not be necessary to remove transition metal species.

Figure 9:
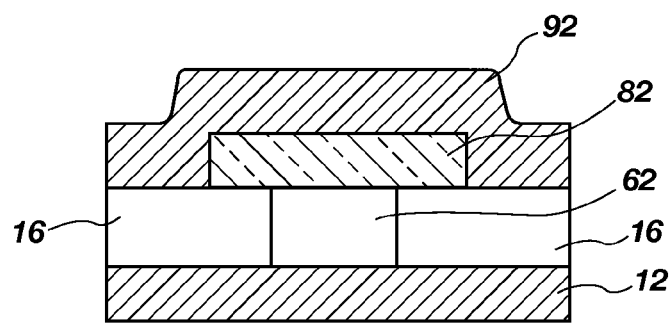

As shown in FIG. 9, a second electrode material 92 may be formed over the metal-doped chalcogenide material 82 and the insulator 16. The second electrode material 92 may overlie exposed portions of the metal-doped chalcogenide material 82 and the insulator 16. The metal-doped chalcogenide material 82 may be substantially surrounded by the second electrode material 92, the insulator 16, and the bottom electrode contact 62. The second electrode material 92 may be similar in composition to the second electrode 32 shown in FIG. 3 and described above. For example, the second electrode material 92 may be tungsten. The second electrode material 92 may be deposited substantially conformally over the doped chalcogenide material 82, and may be formed on an opposite side of the doped chalcogenide material 82 from the first electrode 12.

Figure 10:
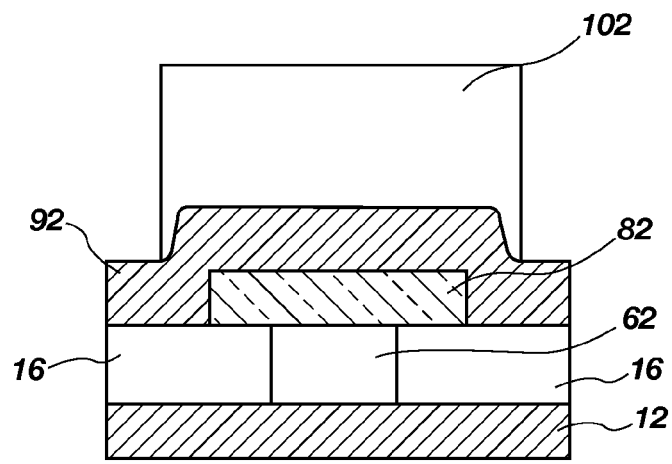

As shown in FIG. 10, a mask 102 may be formed over the second electrode material 92. The width of the mask 102 may be sufficient to protect the entire width of the metal-doped chalcogenide material 82. The mask 102 may be formed of a material similar to the materials described above and shown as mask 42 in FIG. 4. For example, the mask 102 may be a photoresist resistant to an etchant used to remove a portion of the second electrode material 92.

Figure 11:
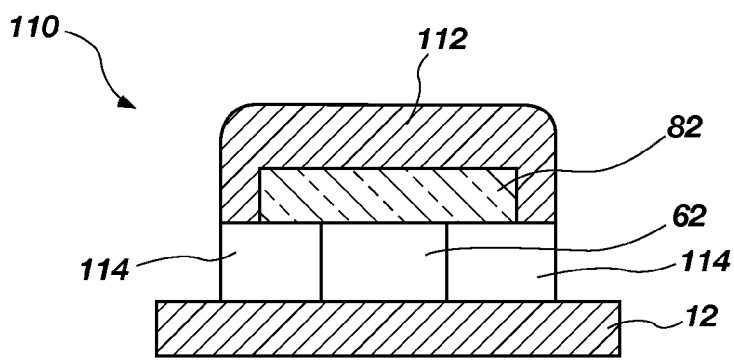

Once the mask 102 has been formed, the second electrode material 92 may be subjected to a third etchant. The third etchant may be selective to the second electrode material 92 and the insulator 16, and may exhibit lower rates of removal of the mask 102 and first electrode 12 than rates of removal of the second electrode material 92 and insulator 16. In other words, during exposure to the third etchant, a portion of the second electrode material 92 and a portion of the insulator 16 not covered by the mask 102 may be removed without substantially removing the mask 102 and the first electrode 12. The third etchant may be selected by a person of ordinary skill in the art based on the materials used as the second electrode material 92, the insulator 16, and mask 102. After exposure to the third etchant, the remaining portion of the second electrode material 92 may form a second electrode 112 of a planar memory cell 110 (or crosspoint memory cell) as shown in FIG. 11. The remaining portion of the insulator 16 may form insulator 114.

The mask 102 may then be removed, such as with a fourth etchant. The fourth etchant may be selective to mask 102, and may remove the mask 102 without substantially removing the first electrode 12, the insulator 114, or the second electrode 112. The fourth etchant may be selected by a person of ordinary skill in the art based on the materials used as the second first electrode 12, the insulator 114, the second electrode 112, and mask 102.

In addition to use in the formation of confined memory cells 50 and planar memory cells 110, the methods described herein may be used to form a metal-doped chalcogenide material in any configuration in which an insulative material and a chalcogenide material are exposed. For example, the methods may be used to form a metal-doped chalcogenide material in a so-called "Tee" cell (i.e., a memory cell having a shape like the letter T), an electrode side-wall cell, or a vertical memory cell. FIGS. 1 through 11 illustrate subtractive etching processes (i.e., pattern and etch) to form the second electrodes 52, 112 and other portions of the memory cells 50, 110. In other embodiments (not shown), cell structures may be fabricated through damascene processes (i.e., pattern, fill, and CMP). The methods may be used to selectively form metal-doped chalcogenide materials without significantly doping exposed insulative material. Therefore, cleaning, masking, or removal of the insulative material may be avoided.

In certain embodiments, the metal-doped chalcogenide materials 24, 82 may be annealed. For example, metal-doped chalcogenide materials 24, 82 may be heated to a temperature of at least 200° C. in a nitrogen environment of approximately ambient pressure or in a vacuum. The metal-doped chalcogenide materials 24, 82 may be maintained at such conditions for a time period of at least about 30 minutes. The metal-doped chalcogenide materials 24, 82 may be annealed at any stage in the production of memory cells 50, 110. For example, the metal-doped chalcogenide materials 24, 82 may be annealed prior to formation of a second electrode 32 or 112, or may be annealed after formation of the second electrode 32 or 112. During an anneal process, materials such as metal dopants may be caused to redistribute within the doped chalcogenide materials 24, 82.

In some embodiments, methods of forming a metal-doped chalcogenide material may be performed two or more times during fabrication of a semiconductor device structure. For instance, in the manufacture of a multi-tiered crosspoint memory array, multiple metal-doped chalcogenide materials may be formed. Two metal-doped chalcogenide materials within a single semiconductor device structure may have the same composition, or may include different chalcogenide materials, different transition metals, and/or different concentrations of the transition metal. In yet other embodiments, a single chalcogenide material 14, 64, may be doped with multiple transition metal species (e.g., Ag and Cu), by exposure to a transition metal solution containing multiple cations (e.g., $Ag^+$ and $Cu^{2+}$) or by sequential exposure to multiple transition metal solutions, each containing cation species.

EXAMPLES

Example 1

Figure 12:
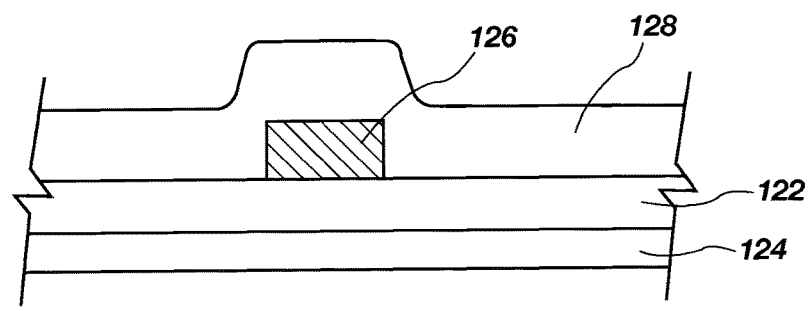
FIGS. 12 through 15 are partial cross-sectional views illustrating semiconductor structures formed to determine properties of metal-doped chalcogenide materials formed by methods according to the present disclosure.

Control. As shown in FIG. 12, silicon nitride 122 ($Si_3N_4$) was formed over a substrate 124. Germanium sulfide 126 ($GeS_2$) was formed over a portion of the silicon nitride 122. Silicon nitride 128 was formed over the germanium sulfide 126 and the silicon nitride 122. The silicon nitride 128 was subjected to an abrasive (CMP) process, forming semiconductor structure 130 shown in FIG. 13. During the CMP process, a portion of the silicon nitride 128 and a portion of the germanium sulfide 126 were removed, leaving an exposed horizontal surface of silicon nitride 132 approximately coplanar with a surface of the germanium sulfide 126. The silicon nitride 132 and the germanium sulfide 126 were approximately 7.5 nm thick. Portions of the surface of the semiconductor structure 130 were tested with X-ray photoelectron spectroscopy (XPS) to determine their elemental compositions. Specifically, surfaces of the silicon nitride 132 and the germanium sulfide 126 were tested to determine the atomic percent (atomic %) of at least one of carbon, nitrogen, oxygen, fluorine, silicon, silver, sulfur, and germanium. The results, shown in Table 1, indicate that the silicon nitride 132 contained carbon, nitrogen, oxygen, fluorine, and silicon. No silver was detected in the silicon nitride 132. The germanium sulfide 126 contained carbon, oxygen, sulfur, and germanium. No nitrogen, silicon, or silver was detected in the germanium sulfide 126.

Example 2

Figure 13:
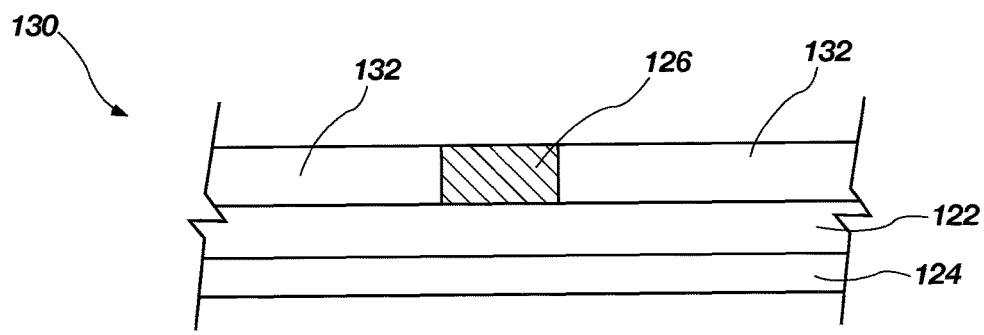
Figure 14:
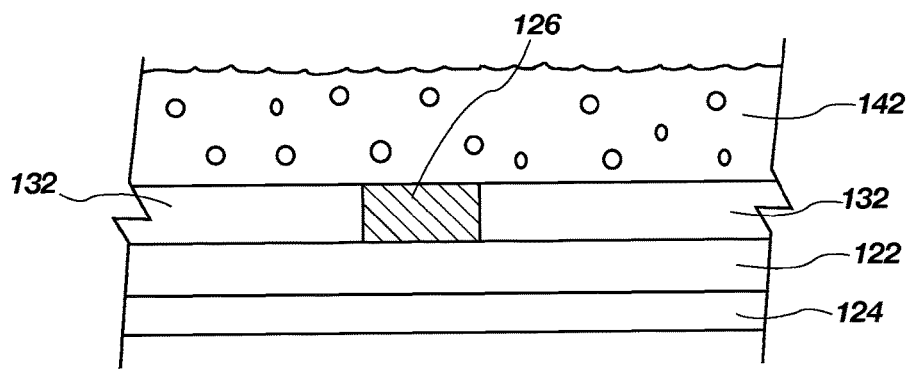
Figure 15:
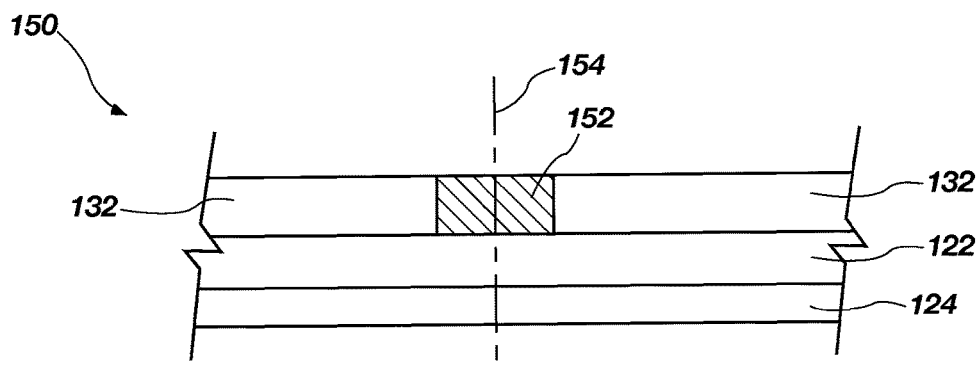

15-Second Doping. A semiconductor structure 130 was prepared and configured as shown in FIGS. 12 and 13 and described above. As shown in FIG. 14, the semiconductor structure 130 was subjected to a 0.1 M aqueous solution 142 of silver nitrate ($AgNO_3$) at a temperature of 25° C. for 15 seconds. The resulting semiconductor structure 150 (FIG. 15) included a silver-doped germanium sulfide 152. Portions of the semiconductor structure 150 were tested with XPS to determine their elemental compositions. Specifically, surface samples of the silicon nitride 132 and the silver-doped germanium sulfide 152 were each tested. The results, shown in Table 1, indicate that the silicon nitride 132 of Example 1 contained carbon, nitrogen, oxygen, fluorine, and silicon. Despite contact with the aqueous solution 142 of silver nitrate, no silver was detected in the silicon nitride 132. The silver-doped germanium sulfide 152 contained carbon, oxygen, sulfur, germanium, and silver.

Example 3

30-Second Doping. A semiconductor structure 130 was prepared and configured as shown in FIGS. 12 and 13 and described above. The semiconductor structure 130 was subjected to a 0.1 M aqueous solution 142 (FIG. 14) of $AgNO_3$ at a temperature of 25° C. for 30 seconds. Portions of the semiconductor structure 150 (FIG. 15) were tested as described in Example 2. As shown in Table 1, the results of XPS testing of the silicon nitride 132 and the silver-doped germanium sulfide 152 of Example 3 showed elemental concentrations similar to those in Example 2, with the exception that a trace amount of silver was detected in the silicon nitride 132.

Example 4

60-Second Doping. A semiconductor structure 130 was prepared and configured as shown in FIGS. 12 and 13 and described above. The semiconductor structure 130 was subjected to a 0.1 M aqueous solution 142 (FIG. 14) of $AgNO_3$ at a temperature of 25° C. for 60 seconds. Portions of the semiconductor structure 150 (FIG. 15) were tested as described in Examples 2 and 3. As shown in Table 1, the results of XPS testing of the silicon nitride 132 and the silver-doped germanium sulfide 152 of Example 4 showed elemental concentrations similar to those in Example 3. A trace amount of silver was detected in the silicon nitride 132.

Example 5

120-Second Doping. A semiconductor structure 130 was prepared and configured as shown in FIGS. 12 and 13 and described above. The semiconductor structure 130 was subjected to a 0.1 M aqueous solution 142 (FIG. 14) of $AgNO_3$ at a temperature of 25° C. for 120 seconds. Portions of the semiconductor structure 150 (FIG. 15) were tested as described in Examples 2 through 4. As shown in Table 1, the results of XPS testing of the silicon nitride 132 and the silver-doped germanium sulfide 152 of Example 5 showed elemental concentrations similar to those in Examples 2 through 4, with the exception that a quantifiable amount of silver (0.1%) was detected in the silicon nitride 132.

TABLE 1

Elemental Composition as Determined by XPS

| Sample | Surface Elemental Concentrations (atomic %) | | | | | | | |
|---|---|---|---|---|---|---|---|---|
| | C | N | O | F | Si | S | Ge | Ag |
| Example 1, SiN area | 5.6 | 33.7 | 24.3 | 0.7 | 35.7 | ND | ND | ND |
| Example 2, SiN area | 4.3 | 34.1 | 24.6 | 0.8 | 36.2 | ND | ND | ND |
| Example 3, SiN area | 3.5 | 34.7 | 24.4 | 0.7 | 36.7 | ND | ND | Tr |
| Example 4, SiN area | 3.1 | 34.1 | 24.8 | 0.6 | 37.3 | ND | ND | Tr |
| Example 5, SiN area | 5.7 | 33.6 | 24.0 | 0.8 | 35.9 | ND | ND | 0.1 |
| Example 1, $GeS_2$ area | 18.3 | ND | 17.6 | ND | ND | 39.0 | 25.1 | ND |
| Example 2, $GeS_2$ area | 21.9 | ND | 11.2 | ND | ND | 19.1 | 2.3 | 45.6 |
| Example 3, $GeS_2$ area | 21.3 | ND | 10.9 | ND | ND | 19.9 | 1.6 | 46.4 |
| Example 4, $GeS_2$ area | 18.5 | ND | 13.9 | ND | ND | 17.0 | 1.8 | 48.7 |
| Example 5, $GeS_2$ area | 22.5 | ND | 11.0 | ND | ND | 20.7 | 2.4 | 43.5 |

ND = not detected
Tr = trace amount detected

Example 6

Figure 16:
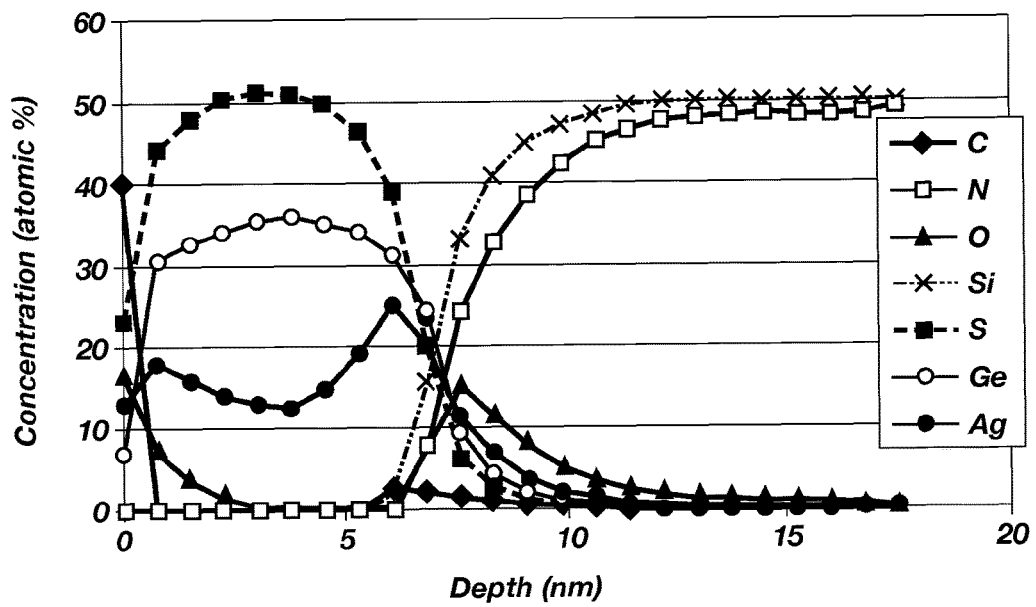
FIGS. 16 through 19 are graphs showing elemental concentrations within metal-doped chalcogenide materials formed by methods according to the present disclosure.

15-Second Doping Sample, Post-Anneal. The semiconductor structure 130 of Example 2 was annealed for a period of 30 minutes at 200° C. and 0.101325 MPa. After annealing, the semiconductor structure 130 was tested with XPS for elemental composition along a depth profile 154 (FIG. 15) beginning at the surface of the silver-doped germanium sulfide 152. That is, the data produced show the concentrations of various elements as a function of depth within the semiconductor structure 130. The results of the XPS test are shown in FIG. 16. The thickness of the silver-doped germanium sulfide 152 in the semiconductor structure 130 was about 7.5 nm, as indicated by the rise in the concentrations of silicon and nitrogen at that depth. FIG. 16 shows that, after annealing, the silver was distributed throughout the depth of the silver-doped germanium sulfide 152, with concentrations between about 10% and 25%.

Example 7

Figure 17:
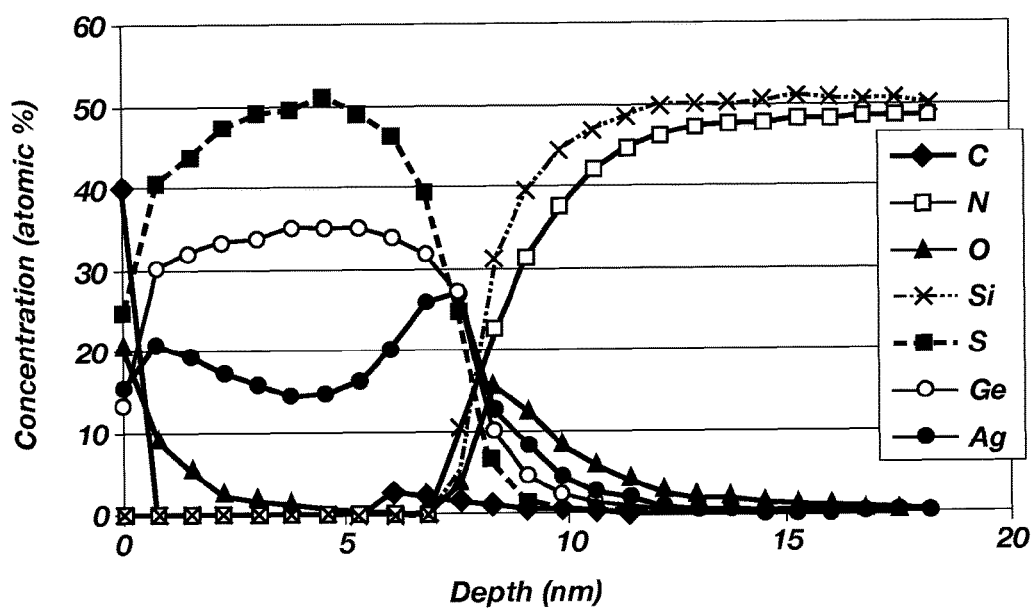

30-Second Doping Sample, Post-Anneal. The semiconductor structure 130 of Example 3 was annealed for a period of 30 minutes at 200° C. and 0.101325 MPa. After annealing, the semiconductor structure 130 was tested as described in Example 6. The results of the XPS test are shown in FIG. 17. After annealing, the silver was distributed throughout the depth of the silver-doped germanium sulfide 152, with concentrations between about 15% and 25%.

Example 8

Figure 18:
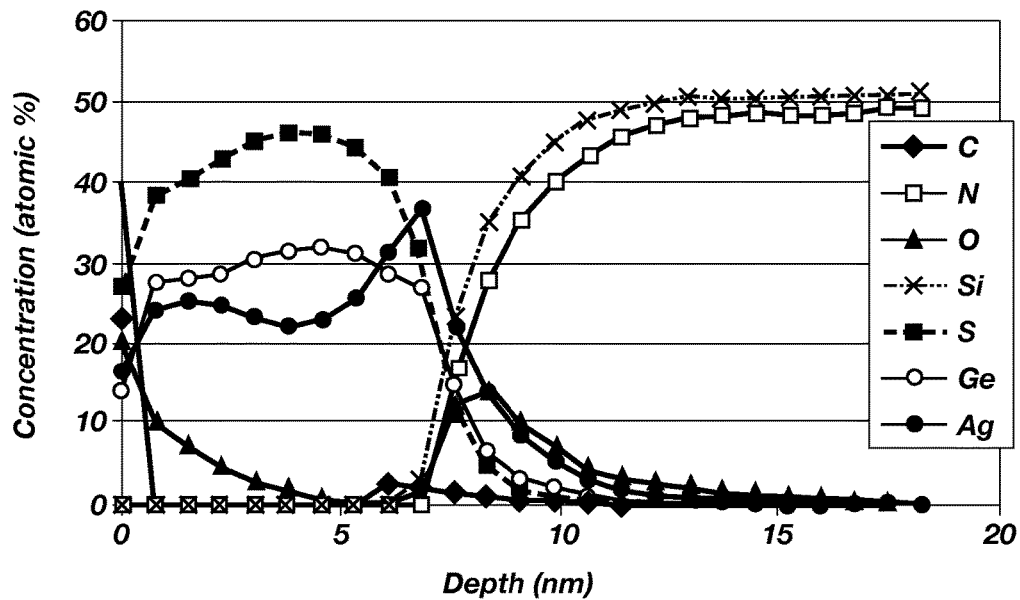

60-Second Doping Sample, Post-Anneal. The semiconductor structure 130 of Example 4 was annealed for a period of 30 minutes at 200° C. and 0.101325 MPa. After annealing, the semiconductor structure 130 was tested as described in Example 6. The results of the XPS test are shown in FIG. 18. After annealing, the silver was distributed throughout the depth of the silver-doped germanium sulfide 152, with concentrations between about 20% and 35%.

Example 9

Figure 19:
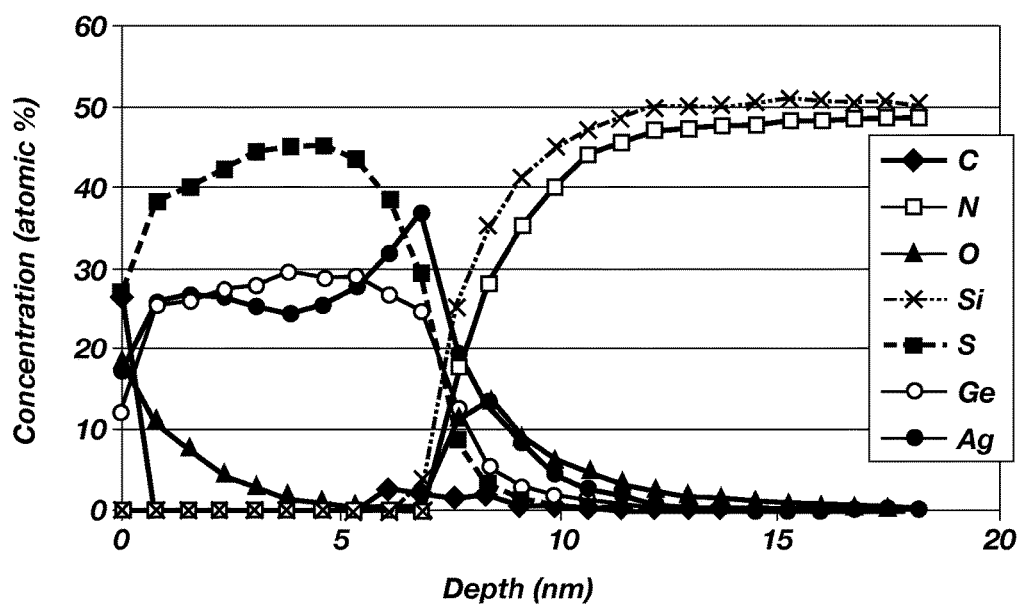

120-Second Doping Sample, Post-Anneal The semiconductor structure 130 of Example 5 was annealed for a period of 30 minutes at 200° C. and 0.101325 MPa. After annealing, the semiconductor structure 130 was tested as described in Example 6. The results of the XPS test are shown in FIG. 19. After annealing, the silver was distributed throughout the depth of the silver-doped germanium sulfide 152, with concentrations between about 25% and 40%.

CONCLUSION

In one embodiment, the present disclosure includes a method of selectively forming a metal-doped chalcogenide material. The method comprises exposing a chalcogenide material to a transition metal solution. The chalcogenide material is not silver selenide. The transition metal of the transition metal solution is incorporated into the chalcogenide material without substantially incorporating the transition metal into an adjacent material.

Another embodiment of the present disclosure includes a method of selectively doping a chalcogenide material. The method comprises forming a chalcogenide material adjacent to and in contact with an insulative material, exposing the chalcogenide material and the insulative material to a transition metal solution, and diffusing transition metal of the transition metal solution into the chalcogenide material while substantially no transition metal diffuses into the insulative material.

Yet another embodiment of the present disclosure includes a method of forming a semiconductor device structure that comprises forming a chalcogenide material over and in contact with an insulative material and exposing a plurality of portions of the insulative material through openings in the chalcogenide material. The chalcogenide material and the plurality of portions of the insulative material are subjected to an aqueous transition metal solution so that the transition metal of the aqueous transition metal solution is incorporated into the chalcogenide material while the insulative material remains substantially free of the transition metal. A first electrode is formed on a first side of the chalcogenide material and a second electrode is formed on a second side of the chalcogenide material.

Still yet another embodiment of the present disclosure includes a method of selectively doping a chalcogenide material that comprises doping a chalcogenide material of a memory cell with at least one transition metal without using an etching or chemical mechanical planarization process to remove the at least one transition metal from an insulative material of the memory cell, wherein the chalcogenide material is not silver selenide.

While the invention is susceptible to various modifications and alternative forms, specific embodiments have been shown, by way of example, in the drawings and have been described in detail herein. However, the invention is not intended to be limited to the particular forms disclosed. Rather, the invention is to cover all modifications, equivalents, and alternatives encompassed by the invention as defined by the following appended claims and their legal equivalents.

What is claimed is:

1. A method of selectively doping a chalcogenide material, comprising:
    forming a chalcogenide material substantially free of a selected transition metal in contact with an insulative material; and
    exposing the chalcogenide material and the insulative material to a solution comprising the selected transition metal to diffuse the selected transition metal into the chalcogenide material without substantially diffusing the selected transition metal into the insulative material.

2. The method of claim 1, wherein forming a chalcogenide material substantially free of a selected transition metal in contact with an insulative material comprises forming a chalcogenide material comprising at least one element selected from the group consisting of N, Si, Ni, Ga, Ge, As, Ag, In, Sn, Sb, Au, Pb, and Bi.

3. The method of claim 1, wherein forming a chalcogenide material substantially free of a selected transition metal in contact with an insulative material comprises forming at least one of a binary chalcogenide, a ternary chalcogenide, and a quaternary chalcogenide.

4. The method of claim 1, wherein forming a chalcogenide material substantially free of a selected transition metal in contact with an insulative material comprises forming a chalcogenide material comprising at least one material selected from the group consisting of $GeS_2$, GeSe, GeTe, $SnS_2$, SnSe, SnTe, $As_2S_3$, $As_2Se_3$, AsTe, $Sb_2S_3$, $Sb_2Se_3$, SbTe, $Sb_2Te_3$, $In_2Se_3$, SnTe, $Bi_2Te_3$, SnSe, InTe, GeSbTe, GeAsSeTe, GeSeTeTl, and GeSeTe.

5. The method of claim 1, wherein exposing the chalcogenide material and the insulative material to a solution comprising the selected transition metal comprises diffusing the selected transition metal into the chalcogenide material without photodoping the chalcogenide material.

6. The method of claim 1, wherein exposing the chalcogenide material and the insulative material to a solution comprising the selected transition metal comprises oxidizing and removing a cationic species from the chalcogenide material.

7. The method of claim 1, wherein exposing the chalcogenide material and the insulative material to a solution comprising the selected transition metal comprises increasing a concentration of chalcogenide ions in the solution.

8. The method of claim 1, wherein exposing the chalcogenide material and the insulative material to a solution comprising the selected transition metal comprises diffusing the selected transition metal into the chalcogenide material to form a metal-doped chalcogenide material comprising from about 1 atomic percent to about 50 atomic percent of the transition metal.

9. The method of claim 1, wherein exposing the chalcogenide material and the insulative material to a solution comprising the selected transition metal comprises forming a phase-separated material comprising a first phase having a first concentration of the selected transition metal and second phase having a second, different concentration of the selected transition metal.

10. The method of claim 1, wherein exposing the chalcogenide material and the insulative material to a solution comprising the selected transition metal comprises forming a concentration gradient of the selected transition metal in the chalcogenide material.

11. The method of claim 1, wherein exposing the chalcogenide material and the insulative material to a solution comprising the selected transition metal comprises forming a homogeneous composition of the selected transition metal in the chalcogenide material.

12. The method of claim 1, further comprising dissolving a transition metal salt in water to form the solution comprising the selected transition metal.

13. The method of claim 1, further comprising annealing the chalcogenide material.

14. The method of claim 1, further comprising exposing the chalcogenide material to UV irradiation subsequent to exposing the chalcogenide material and the insulative material to a solution comprising the selected transition metal.

15. A method of forming a semiconductor device, comprising:
    forming an insulative material over a first electrode;
    forming a chalcogenide material metal over the first electrode, wherein the chalcogenide material is adjacent to and in contact with the insulative material and wherein the chalcogenide material comprises less than or equal to 1 atomic percent of a selected transition metal within 20 Å of an exposed surface thereof;
    exposing the chalcogenide material and the insulative material to a solution comprising the selected transition metal to diffuse the selected transition metal into the chalcogenide material without substantially diffusing the selected transition metal into the insulative material; and
    forming a second electrode over the chalcogenide material and the insulative material.

16. The method of claim 15, further comprising forming a mask over the second electrode and subjecting the mask and an exposed portion of the second electrode to an etchant to remove exposed material of the second electrode.

17. A method of forming a semiconductor device, comprising:
    forming an insulative material over a first electrode;
    forming an electrode contact over the first electrode;
    forming a chalcogenide material substantially free of a selected transition metal over and in contact with each of the insulative material and the electrode contact;
    exposing the chalcogenide material and the insulative material to a solution comprising the selected transition metal to diffuse the selected transition metal into the chalcogenide material without substantially diffusing the selected transition metal into the insulative material; and
    forming a second electrode over the chalcogenide material and the insulative material.

18. The method of claim 17, wherein forming a second electrode over the chalcogenide material and the insulative material comprises forming the second electrode in contact with each of the chalcogenide material and the insulative material.

19. The method of claim 17, further comprising:
    forming a mask material over a portion of the second electrode; and
    exposing the mask material and an exposed portion of the second electrode to an etchant.

20. The method of claim 19, wherein exposing the mask material and an exposed portion of the second electrode to an etchant comprises removing a portion of the second electrode and a portion of the insulative material from over the first electrode.

* * * * *

UNITED STATES PATENT AND TRADEMARK OFFICE
CERTIFICATE OF CORRECTION

| | |
|---|---|
| PATENT NO. | : 9,614,153 B2 |
| APPLICATION NO. | : 14/607329 |
| DATED | : April 4, 2017 |
| INVENTOR(S) | : Jerome A. Imonigie et al. |

It is certified that error appears in the above-identified patent and that said Letters Patent is hereby corrected as shown below:

In the Specification

Column 3, Line 62, change "SnTe, $Bi_2Te_3$, SnSe," to --$Bi_2Te_3$,--

Column 11, Line 29, change "Post-Anneal The" to --Post-Anneal. The--

In the Claims

Claim 4, Column 12, Line 50, change "SnTe, $Bi_2Te_3$, SnSe," to --$Bi_2Te_3$,--

Claim 15, Column 13, Line 35, change "material metal over" to --material over--

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*